(12) United States Patent
Mingo Bisquert et al.

(10) Patent No.: US 8,961,810 B2
(45) Date of Patent: Feb. 24, 2015

(54) SIGE MATRIX NANOCOMPOSITE MATERIALS WITH AN IMPROVED THERMOELECTRIC FIGURE OF MERIT

(76) Inventors: Natalio Mingo Bisquert, Sassenage (FR); Nobuhiko Kobayashi, Sunnyvale, CA (US); Marc Plissonnier, Eybens (FR); Ali Shakouri, Santa Cruz, CA (US)

(*) Notice: Subject to any disclaimer, the term of this patent is extended or adjusted under 35 U.S.C. 154(b) by 723 days.

(21) Appl. No.: 13/003,672

(22) PCT Filed: Jul. 11, 2008

(86) PCT No.: PCT/IB2008/002794
§ 371 (c)(1),
(2), (4) Date: Apr. 29, 2011

(87) PCT Pub. No.: WO2010/004360
PCT Pub. Date: Jan. 14, 2010

(65) Prior Publication Data
US 2011/0195185 A1 Aug. 11, 2011

(51) Int. Cl.
C23C 16/22 (2006.01)
H01L 35/22 (2006.01)
C23C 16/30 (2006.01)
H01L 35/26 (2006.01)

(52) U.S. Cl.
CPC ............... H01L 35/22 (2013.01); C23C 16/30 (2013.01); H01L 35/26 (2013.01); Y10S 977/784 (2013.01); Y10S 977/833 (2013.01)
USPC ....... 252/62.3 T; 136/239; 428/621; 428/641; 977/784; 977/833

(58) Field of Classification Search
USPC .............. 252/62.3 T; 136/239; 428/621, 641; 977/784, 833
See application file for complete search history.

(56) References Cited

U.S. PATENT DOCUMENTS 3,285,017 A * 11/1966 Henderson et al. ............... 62/3.7
2006/0102224 A1* 5/2006 Chen et al. .................... 136/203
2008/0202575 A1* 8/2008 Ren et al. ...................... 136/201

FOREIGN PATENT DOCUMENTS

JP 09-100166 * 4/1997
WO WO 2008/140596 A2 11/2008

OTHER PUBLICATIONS

Translation of JP 9-100166, Apr. 1997.*
Search Report and Written Opinion for International Application No. PCT/IB2008/002794, mailed May 7, 2009; 9 pages.
Chen, L.J., et al.; "Nanoscale iron disilicides"; Thin Solid Films; vol. 515; Issue 22; Aug. 15, 2007; pp. 8140-8143; XP022199925.
Scoville, N., et al; "Thermal Conductivity Reduction in SiGe Alloys By The Addition Of Nanophase Particles"; NanoStructured Materials; vol. 5; Issue 2; Feb. 1, 1995; pp. 207-223; XP004174904.

* cited by examiner

Primary Examiner — Carol M Koslow
(74) Attorney, Agent, or Firm — Alston & Bird LLP

(57) ABSTRACT

Nanocomposite materials comprising a SiGe matrix with silicide and/or germanide nanoinclusions dispersed therein, said nanocomposite materials having improved thermoelectric energy conversion capacity.

13 Claims, 2 Drawing Sheets

Estimation for iron silicide in $Si_{0.5}Ge_{0.5}$ at 300K

SIGE MATRIX NANOCOMPOSITE MATERIALS WITH AN IMPROVED THERMOELECTRIC FIGURE OF MERIT

FIELD OF THE INVENTION

The invention is directed to nanocomposite materials based on a SiGe matrix with improved thermoelectric energy conversion capacity.

BACKGROUND

Thermoelectric materials are the building blocks of two types of devices (G. S. Nolas, J. Sharp, and H. J. Goldsmid, Thermoelectrics: Basic Principles and New Materials Developments, Springer (2006)):

1-thermoelectric power generators, capable of converting a heat current into usable electric power, and 2-thermoelectric coolers, capable of refrigerating an object by the only use of electric currents.

These devices are technologically very interesting because they are purely solid state based, which means they do not have moving parts, they are free of vibrations, reliable, compact, and light weight. This makes them ideal for aerospace or micro-electronics applications, for example. However, their efficiency is much lower than that of mechanical energy conversion devices. This limits their applicability in more conventional fields, like usual kitchen refrigerators for example.

A direct measure of a material's ability to be part of a thermoelectric device is given by its dimensionless thermoelectric figure of merit, ZT, defined as $T\sigma S^2/\kappa$, where T is the temperature, $\sigma$ is the electrical conductivity, S is the Seebeck coefficient, and $\kappa$ the thermal conductivity of the material, respectively (G. S. Nolas, J. Sharp, and H. J. Goldsmid, Thermoelectrics: Basic Principles and New Materials Developments, Springer (2006)). The performance of thermoelectric refrigeration and power generation is hindered by the low ZT of currently known materials. Currently, the best bulk thermoelectric materials have ZT values around 1 at room temperature. Nanostructured materials have shown hints of higher room temperature ZT~2 in two publications (Venkatasubramanian, R. et al., "Thin-film Thermoelectric Devices with High Room-temperature Figures of Merit", Nature, Vol 413, 11 Oct. 2001 pp. 597-602; T. C. Harman, P. J. Taylor, M. P. Walsh, B. E. LaForge, Quantum Dot Superlattice Thermoelectric Materials and Devices, Science 297, pp. 2229 (2002)). A general and ambitious goal of thermoelectrics research is to produce a material with ZT>3 at room temperature. Such material would enable thermoelectric refrigeration with efficiencies comparable to those of pressure based refrigeration, thus opening the market for industrial thermoelectric refrigeration.

A smaller but very important application of thermoelectric refrigeration is in cooling hotspots in microelectronics. A hotspot is an area of the device that does not dissipate heat fast enough, so its temperature becomes too high, affecting performance. A solution to this problem is to actively pump the heat out of the area, by means of an integrated thermoelectric microcooler (A. Shakouri, Nanoscale Thermal Transport and Microrefrigerators on a Chip, Proceedings of IEEE, 94, 1613 (2006)). Shakouri A. has investigated this issue experimentally, using SiGe alloy based microrefrigerators on a chip (Proceeding of the IEEE, vol. 94, no 8, 2006, 1613-1638).

There are several problems when trying to make integrated microrefrigerators suitable for electronic hotspot cooling and related applications. First of all, the refrigerator should be monolithically integrated in the system, so that heat can flow well from the hotspot to the refrigerator, and parasitic interface thermal resistances between them are minimized. In the current silicon based industry, this restricts the available materials to just those compatible with Si technology.

Known thermoelectric materials such as $Bi_2Te_3$, or III-V semiconductors, are not suitable to be integrated. An obvious material choice for the refrigerator is SiGe alloys. However, it has been shown by Shakouri's group (A. Shakouri, Nanoscale Thermal Transport and Microrefrigerators on a Chip, Proceedings of IEEE, 94, 1613 (2006)) that SiGe is not efficient enough for most hotspot cooling applications, because its room temperature ZT is only around 0.1. It was further shown by modeling that if one could increase the ZT of SiGe alloys to 0.5 at room temperature, the maximum possible cooling in the microrefrigerator would increase from 4 K to at least 15 K, and even up to 25 K, if ZT increase is due to power factor enhancement. According to Shakouri, a 15 degree cooling renders the microcooler much more useful for hotspots (4 is still insufficient), and developing a SiGe based material with ZT~0.5 at room temperature would represent a revolution in the area of microelectronics.

Thus the problem that the invention has intended to solve has been to find a SiGe based material, monolithically integrable into Si based technology, with ZT~0.5 at room temperature, suitable for use in microrefrigerators on a chip.

One strategy to enhance materials' ZT is the inclusion of nanoparticles (particles with sizes ranging from 1 to a few tens of nm) into the material, to form a "nanocomposite." The embedding material is known as the "matrix", and the nanoparticles are termed the "filler." This approach was successfully used by Shakouri and collaborators to enhance the ZT of InGaAs alloys, using ErAs nanoparticles as a filler (Kim, W., Zide, J., Gossard, A., Klenov, D., Stemmer, S., Shakouri, A., and Majumdar, A., "Thermal conductivity reduction and thermoelectric figure of merit increase by embedding nanoparticles in crystalline semiconductors," Phys. Rev. Lett. 96, 045901 (2006)). For the approach to result in enhanced ZT, it appears to be crucial that the nanoparticles blend well into the matrix, without creating defects or dislocations which would negatively affect the electrical conductivity and lower the ZT (A. Shakouri, Nanoscale Thermal Transport and Microrefrigerators on a Chip, Proceedings of IEEE, 94, 1613 (2006)). But even if this is fulfilled, there is no guarantee that the ZT of the nanocomposite will be higher than that of the original matrix. It is not enough to just embed nanoparticles: their size, composition and concentration must be such that their effect on thermal conductivity, electrical conductivity, and Seebeck coefficient does effectively enhance ZT.

US-2006/0102224 has disclosed nanostructured materials made of a matrix wherein inclusions of nanoparticles are dispersed, wherein the matrix and the nanoparticles are of different composition and both are based on Ge and/or Si.

However experimental results have not shown any ZT improvement in SiGe nanostructured materials (A. Shakouri, Proceedings of the IEEE, 94, 1613, 2006).

The invention has solved the problems of the prior art by providing new materials comprising a SiGe matrix with silicide nanoparticles and/or germanide nanoinclusions, like for example nanoparticles dispersed therein.

Chen H. C. et al., Thin Solid Films, 461, 2004, 44-47, discloses a material made of $Si/Si_{0.8}Ge_{0.2}$ (001) substrate with epitaxial $\beta$-$FeSi_2$ nanodots grown on its surface.

Wu W. W. et al., Applied Physics Letters, 83(9), 2003, 1836-1838, discloses a material made of a $Si_{0.7}Ge_{0.3}$ on (001) Si matrix with NiSi quantum-dot arrays grown thereon.

However, these materials only comprise a surface layer of silicide nanoparticles.

SUMMARY

The invention solves the problem of finding a material compatible with Si technology, for the realization of integrated thermoelectric energy conversion devices in microelectronics. It solves the problem of finding a material suitable for thermoelectric microcoolers, capable of at least a 15 K cooling, and thus superior to the so far demonstrated 4 K. It also solves the problem of enhancing the figure of merit of SiGe based materials in a general sense.

DETAILED DESCRIPTION

A first object of the invention is a nanocomposite material comprising a SiGe matrix and a plurality of nanosized inclusions distributed within said matrix.

The matrix is based on a SiGe alloy which can be described by the formula:

$$Si_xGe_{(1-x)}$$

wherein x is a number comprised strictly between 0 and 1: $0<x<1$. Advantageously, $0.3 \leq x \leq 0.8$, and even more preferably, $0.4 \leq x \leq 0.7$.

The term "nano-sized inclusion", as used herein, generally refers to material portions, such as nanoparticles, whose dimensions are equal or preferably less than about 100 nm. For example, they can refer to nanoparticles having an average cross-sectional diameter in a range of about 1 nanometer to about 100 nm, or in a range of about 3 nm to about 30 nm.

The nano-sized inclusions can be randomly distributed within the composite. Or the nano-sized inclusions can be distributed according to a pattern.

Preferably nanoinclusions are nanoparticles, which means that their shape is more or less regular and can be described as: spherical, ovoid, a flattened sphere, a flattened ovoid or a rod.

Nanocomposite materials of the invention can be characterized by the nanoparticles' radius, r, the half of their largest diameter, and $V_f$, the volumetric fraction of nanoinclusions within the matrix.

More precisely, $V_f$ is the volume ratio of nanoinclusions with regards to the SiGe matrix volume.

Figure 1:
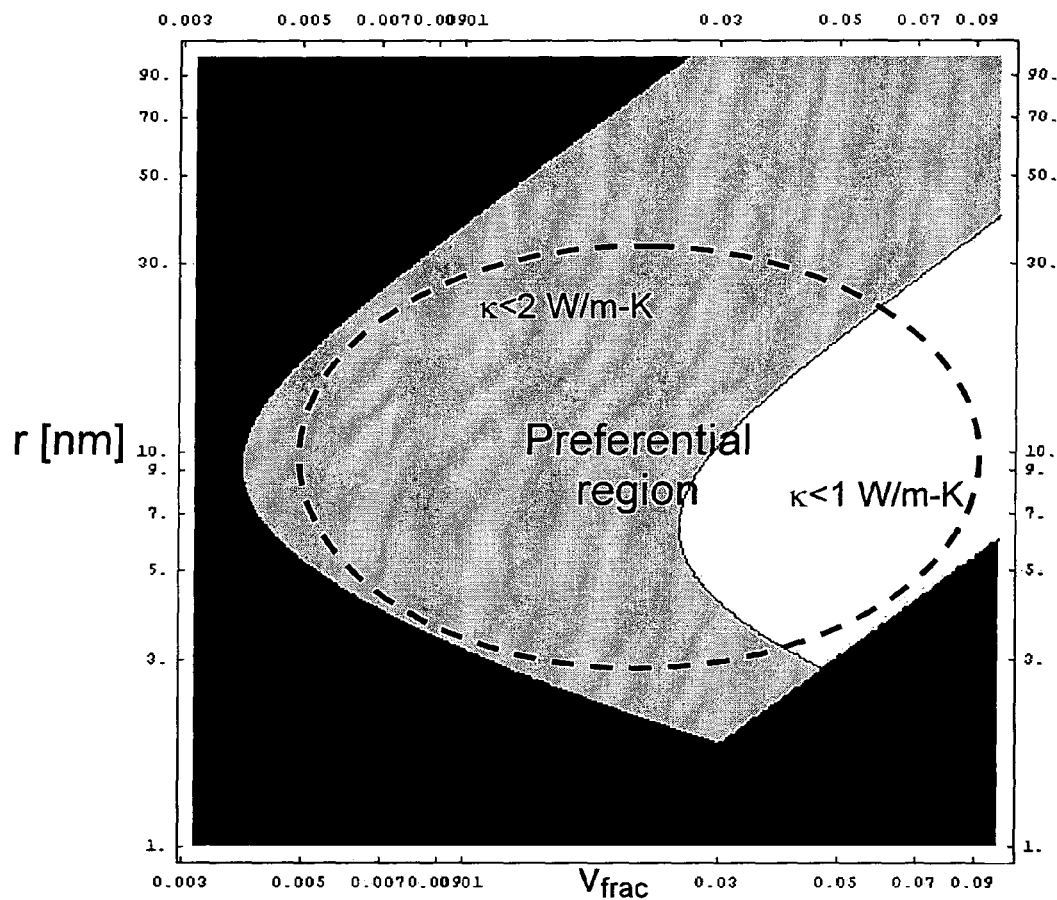
FIG. 1 graphically depicts an estimation for iron silicide in $Si_{0.5}Ge_{0.5}$ at 300 K.

The limits of r and $V_f$ are illustrated in FIG. 1, the preferential zone being defined by the points inside the dashed line.

The volume fraction $V_f$ is preferably included within the following limits:

$$0.1\% \leq V_f \leq 10\%$$

A variety of different materials can be employed to form the nanoinclusions. In a general manner they can be defined as silicide and/or germanide of a compound selected from: transition metals, lanthanides and actinides.

The expression "transition metals" defines the atoms in group 3 to 12 of the periodic table. They are the 40 chemical elements 21 to 30, 39 to 48, 71 to 80 and 103 to 112.

The expression "Lanthanides" designates the 15 elements 57 to 71.

The expression "Actinides" designates the 15 elements 89 to 103.

The favorite compounds selected from the group consisting of transition metals, lanthanides and actinides are semiconductors for which the band edge offset of the nanoparticle is positive with regards to that of the matrix.

A silicide and/or germanide of those compounds is a material responding to a formula (I)

$$Si_nGe_mA_p \qquad (I)$$

Wherein A is a compound selected from transition metals, lanthanides, actinides, n, m, p are integers.

$n \geq 0$, $m \geq 0$, $p \geq 0$, n and m cannot be both 0.

When m=0, molecules of formula (I) are called silicides and respond to the formula:

$$Si_nA_p \qquad (II)$$

wherein n and p are both strictly positive integers.

This is one of the favorite embodiments of the invention.

Favorite silicides are those wherein A is selected from the group consisting of: Mg, Ti, V, Ni, Mo, Er, Yb, W, Fe, Cr, Co, Mn, Ru, Os, Ir, and even more preferably A is selected from the following group: Ir, Ru, Fe, Ni, W, Co.

Nanoinclusion material is advantageously selected from: $Mg_2Si$, $TiSi_2$, $VSi_2$, $NiSi_2$, $MoSi_2$, $ErSi_2$, $YbSi_2$, $WSi_2$, $\beta$-$FeSi_2$, $CrSi_2$, $MnSi_2$, $RuSi_3$, $OsSi_2$, $Ir_3Si_5$, $Os_2Si_3$, $OsSi$.

In addition, one or both of the matrix and the nanoinclusion materials can be doped with a dopant, like an n-type or a p-type dopant. When a dopant is included in one or both of these materials, its concentration with regards to the matrix or the nanoinclusions is preferably less than 1% weight/weight. For example boron can be used as a p-type dopant and phosphorus as an n-type dopant.

The presence of nanoinclusions within the matrix leads to a nanocomposite material which exhibits a reduction in thermal conductivity relative to a homogeneous alloy made of the matrix material by a factor at least 2, like a factor in a range from 2 to 10, preferably more than 5.

In addition, the nanocomposite material of the invention exhibits a thermoelectric figure of merit (ZT) which is superior or equal to 0.5 at room temperature. The nanocomposite thermoelectric material accordingly to the teachings of the invention, advantageously exhibits an enhanced thermoelectric figure-of-merit (Z) which can be defined as follows:

$$Z = \frac{S^2 \sigma}{k}$$

Where S is the Seebeck coefficient, $\sigma$ is the electrical conductivity of the composite material, and k is its thermal conductivity. The figure-of-merit Z has the units of inverse Kelvin. In many cases, a dimensionless figure-of-merit (ZT), obtained as a product of Z and an average device temperature (T), is employed. A nanocomposite thermoelectric composition according to the teachings of the invention can exhibit a thermoelectric figure-of-merit (ZT) that can be greater than about 0.5 at room temperature. Since ZT of bulk SiGe increases with temperature, ZT reaches the value 1 at 1200 K. Thus, due to its lowered thermal conductivity, the silicide SiGe nanocomposite material of the invention may reach ZT=2 at high temperature, like around 1200 K.

Another advantage of the invention is that the nanocomposite material has an electrical conductivity ($\sigma$) which is very close to that of the matrix material. The Seebeck coefficient, S, of the nanocomposites is superior or equal to that of the matrix material.

Another object of the invention is a method of making a nanocomposite material according to the invention, wherein said method comprises growing a buffer layer on a substrate and growing a nanocomposite structure on the buffer layer.

Advantageously, the substrate is a Si substrate.

The buffer layer is intended to make the mesh parameter of the Si substrate fit with that of the nanocomposite material, in order to reduce strains. According to a first favorite variant, the buffer layer can be continuous and have a gradient of mesh parameter from Si to SiGe by regularly modifying the SiGe composition. According to a second favorite variant, the buffer layer can be made of a multilayer material with a SiGe composition progressing from that of the Si layer to that of the nanocomposite material.

According to the case, nanoinclusions have a crystalline structure or a solid solution structure. Crystalline structure is preferred.

According to a first favorite variant, the method preferably includes growing the nanocomposite structure by Chemical Vapor Deposition (CVD).

Samples were grown on a Si substrate, using a CVD System.

Nanocomposite materials of the invention were grown by co-depositing $Si_nGe_mA_p$ at a selected growth rate corresponding to the desired atomic fraction during the growth of the $Si_xGe_{(1-x)}$ matrix.

When a patterned structure is desired, alternate growth of $Si_nGe_mA_p$ layers and $Si_xGe_{(1-x)}$ layers are combined with appropriate layer spacings.

Preferably, the nanocomposite structures of the invention are grown by a Chemical Vapor Deposition (CVD) method. In the CVD process, a Si substrate is exposed to one or more volatile precursors, which react and/or decompose on the substrate surface to produce the desired deposit.

The CVD method is more appropriate for industrial scale production of nanocomposite structures.

Suitable precursors for Si and Ge are: silanes, dichlorosilanes, $GeH_4$.

Metals sources are generally chlorides or fluorides of such metals, like: $RuF_6$, $WF_6$, $MoCl_5$.

For a random distribution nanocomposite, a growth rate is selected which corresponds to the desired atomic fraction. When a patterned structure is expected, the alternate growth of $Si_nGe_mA_p$ layers and $Si_xGe_{(1-x)}$ layers is combined with appropriate layer spacings.

Process parameters are controlled to obtain nanoparticle size and volumetric fraction which have been selected: among those parameters, one can mention temperature, time, surfactant use, like $PH_3$, $B_2H_6$.

According to another variant, another favorite method for the growth of the nanocomposite structures of the invention is Molecular Beam Epitaxy (MBE)

Nanocomposite materials of the invention have improved thermoelectric figure of merit, ZT and power factor comparable to or higher than that of SiGe alloys, thanks to the fact that nanoinclusions blend well into the matrix, without creating defects and dislocations.

Another object of the invention is an electronic component including at least one layer of the nanocomposite material of the invention.

Advantageously such an electronic component is selected from: thermoelectric power generators and thermoelectric coolers.

Figure 2:
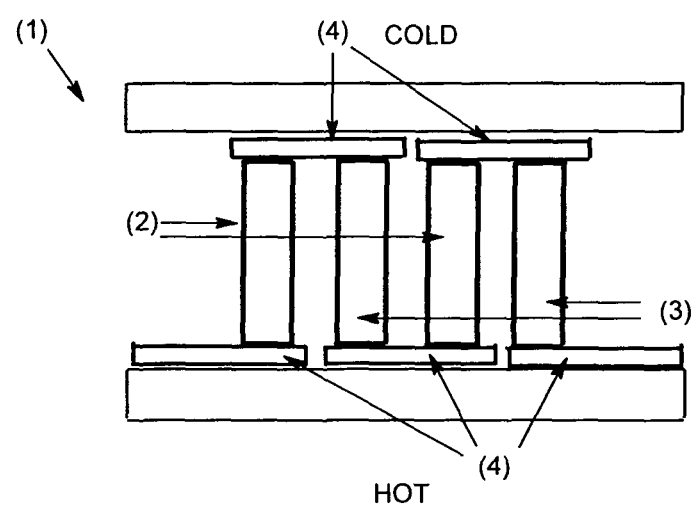
FIG. 2 schematically depicts a thermoelectric cooler formed as an assembly of thermoelectric elements.

Thermoelectric nanocomposite materials of the invention advantageously find applications in both refrigeration and power generation. For example, they can be utilized in thermal management of microelectronics and photonic devices. They can also be employed as thermoelectric power generators for direct conversion of thermal energy to electrical energy at a high efficiency. For example, FIG. 2 schematically depicts a thermoelectronic cooler (1) formed as an assembly of thermoelectric elements, consisting of modules such as (2) and (3). The elements are electrically connected in series (but they could also be connected in parallel or as a combination of serial and parallel connections, the type of connection depends on the needs and power supplies) with current flowing alternatively through p-type and n-type legs. The legs are formed of nanocomposites of the invention.

The legs (2) and (3) of the devices are connected through electrically conductive bridges (4) to adjacent legs in a cascading fashion. Application of a current causes transfer of heat from one side of the thermoelectric cooler to the other, thereby lowering the temperature at one side while increasing the temperature at the opposite side.

Experimental Part

The process is separated in two sequential steps that provide SiGe layer and MoSi silicide dots on its surface. These two sequential steps are then repeated several times to form a SiGe nanocomposite with MoSi inclusions.

First Sequential Step:

SiGe nanocomposite layers are grown by reduced pressure chemical vapor deposition (RP-CVD). This deposition technique has been already used in the literature to realize superlattices (Venkatasubramanian, R. et al., Nature, Vol 413, 11 Oct. 2001 pp. 597-602; A. Shakouri, Proceedings of IEEE, 94, 1613 (2006); Kim, W. et al., Phys. Rev. Lett. 96, 045901 (2006)). CVD offers high quality layers and makes possible the use of in-situ dopping. The growth pressure was always 10 Torr. The flow of $H_2$ carrier gas was set at a fixed value of about between 10 and 15 of standard liters per minute. Pure silane ($SiH_4$) was used as the source of Si and germane ($GeH_4$) diluted at 10% in $H_2$ as the source of Ge. Doping sources are diborane ($B_2H_6$) and phosphine ($PH_3$) diluted at 1% in $H_2$ as p- and n-type respectively.

Second Sequential Step:

Molybdenum silicide nanoinclusions are grown by injection of 2 to 3 sccm of $MoCl_5$ precursors.

$MoCl_5$ powder is vaporized in dedicated vaporization chamber set at 150° C. The vapor is then introduced into the chamber with $N_2$ carrier gas. $MoCl_5$ precursor is then chemically decomposed on SiGe surface at 1000° C. under H2 carrier flow and SiH4 is used as source of Sifor MoSi formation. After a few seconds (before layer coalescence) the MoCl5 and SiH4 are stopped.

A silicide formation under $H_2$ forming gas is performed at 1000° C. in the same CVD chamber.

After silicide, a new step of SiGe deposition is formed. The new SiGe layer encapsulates the MoSi nanodots.

These process steps can be repeated 2 to 100 times.

Following this sequence of operations we have produced a material comprising 100 layers of 10 nm of SiGe/MoSi2 with ZT=0.5 to 300 K (as a function of the temperature).

The invention claimed is:

1. Nanocomposite material comprising a SiGe matrix with nanoinclusions dispersed therein randomly or according to a pattern, said nanoinclusions being made of a material which responds to formula (I)

$$Si_nGe_mA_p \qquad (I)$$

wherein A is a compound selected from transition metals, lanthanides, actinides, n, m, p are integers, and $$n \geq 0, m > 0, p > 0.$$

2. Nanocomposite material according to claim 1, wherein the matrix is based on a SiGe alloy which can be described by the formula:

$$Si_xGe_{(1-x)}$$

wherein x is a number comprised strictly between 0 and 1: 0<x<1.

3. Nanocomposite material according to claim 2, wherein $0.3 \leq x \leq 0.8$.

4. Nanocomposite material according to claim 1, wherein the nanoinclusions are nanoparticles.

5. Nanocomposite material according to claim 4, wherein the nanoparticles have dimensions less than 100 nm.

6. Nanocomposite material according to claim 4, wherein $V_p$, the volume ratio of nanoparticles with regards to the SiGe matrix volume is included within the following limits:

$$0.1\% \leq V_p \leq 10\%.$$

7. Nanocomposite material according to claim 1, wherein it exhibits a reduction in thermal conductivity relative to a homogeneous alloy made of the matrix material by a factor at least 2.

8. Nanocomposite material according to claim 1, wherein it exhibits a thermoelectric figure of merit (ZT) which is superior or equal to 0.5 at room temperature.

9. Method of making a nanocomposite material according to claim 1 on a substrate having a buffer layer between the material and the substrate, wherein said method comprises growing a buffer layer on a substrate and growing a nanocomposite structure on the buffer layer by a method selected from Molecular Beam Epitaxy and Chemical Vapor Deposition.

10. Method according to claim 9, wherein the substrate is a Si substrate.

11. Electronic component including at least one layer of the nanocomposite material according to claim 1.

12. Electronic component according to claim 11, wherein it is selected from: thermoelectric power generators and thermoelectric coolers.

13. Nanocomposite material according to claim 2, wherein $0.4 \leq x \leq 0.7$.

* * * * *